US006639281B2

United States Patent
Kane et al.

(10) Patent No.: US 6,639,281 B2
(45) Date of Patent: Oct. 28, 2003

(54) METHOD AND APPARATUS FOR PROVIDING A HIGH-PERFORMANCE ACTIVE MATRIX PIXEL USING ORGANIC THIN-FILM TRANSISTORS

(75) Inventors: Michael G. Kane, Skillman, NJ (US); Barry K. Greening, Deptford, NJ (US); Frank Paul Cuomo, Morgan Hill, CA (US)

(73) Assignee: Sarnoff Corporation, Princeton, NJ (US)

( * ) Notice: Subject to any disclaimer, the term of this patent is extended or adjusted under 35 U.S.C. 154(b) by 0 days.

(21) Appl. No.: 10/093,208

(22) Filed: Mar. 7, 2002

(65) Prior Publication Data

US 2002/0145144 A1 Oct. 10, 2002

Related U.S. Application Data

(60) Provisional application No. 60/269,250, filed on Apr. 10, 2001.

(51) Int. Cl.⁷ .......................... H01L 27/01; H01L 27/12; H01L 31/0392
(52) U.S. Cl. .......................... 257/350; 257/59; 257/72; 257/401
(58) Field of Search .......................... 257/59, 72, 350, 257/401

(56) References Cited

U.S. PATENT DOCUMENTS

| 4,597,001 A | 6/1986 | Bortscheller et al. ...... 357/23.7 |
| 4,968,119 A | 11/1990 | Stewart ..................... 350/333 |
| 5,003,356 A | 3/1991 | Wakai et al. ................. 357/4 |
| 5,055,899 A | 10/1991 | Wakai et al. ............. 357/23.7 |
| 5,173,791 A | 12/1992 | Strathman et al. ........... 359/57 |
| 5,258,705 A * | 11/1993 | Okamoto et al. ....... 324/158 R |
| 5,402,254 A | 3/1995 | Sasano et al. ............. 359/59 |
| 5,414,283 A | 5/1995 | Den Boer et al. ........... 257/59 |
| 5,546,205 A | 8/1996 | Sukegawa et al. ........... 359/59 |
| 5,587,329 A | 12/1996 | Hseuh et al. ................. 437/40 |
| 5,596,208 A | 1/1997 | Dodabalapur et al. ....... 257/66 |
| 5,610,738 A | 3/1997 | Sasano et al. ............... 349/43 |
| 5,614,427 A | 3/1997 | Den Boer et al. ........... 437/40 |
| 5,694,185 A | 12/1997 | Oh ............................. 349/46 |
| 5,696,388 A | 12/1997 | Funada et al. ............... 257/64 |
| 5,736,752 A | 4/1998 | Hseuh et al. ................. 257/72 |
| 5,744,821 A | 4/1998 | Song .......................... 257/59 |
| 5,784,131 A | 7/1998 | Kim et al. .................... 349/39 |
| 5,790,090 A | 8/1998 | Libsch et al. ............... 345/94 |
| 5,811,836 A | 9/1998 | Ha ............................. 257/59 |
| 5,835,168 A | 11/1998 | Takeda et al. ............... 349/38 |
| 5,844,646 A | 12/1998 | Yanai ........................ 349/110 |
| 5,870,075 A | 2/1999 | Yamazaki et al. .......... 345/149 |
| 5,874,746 A * | 2/1999 | Holmberg et al. ........... 257/59 |
| 5,877,512 A | 3/1999 | Kim ........................... 257/57 |
| 5,932,892 A | 8/1999 | Hseuh et al. ................. 257/59 |
| 5,981,970 A | 11/1999 | Dimitrakopoulos et al. .. 257/40 |
| 5,994,174 A | 11/1999 | Carey et al. ................ 438/166 |

(List continued on next page.)

OTHER PUBLICATIONS

International Search Report, dated Sep. 20, 2002 for corresponding application, PCT/US02/06965.
Copy of Written Opinion dated May 12, 2003 from corresponding PCT application, PCT/US02/06965.

*Primary Examiner*—Ngân V. Ngô
(74) *Attorney, Agent, or Firm*—William J. Burke

(57) ABSTRACT

A pixel structure having at least one organic thin film transistor (OTFT) that minimizes gate-to-pixel capacitance. In one embodiment, a pixel structure provides a new transistor structure where an OTFT electrode on the data-line side of the transistor is extended or wrapped around three sides of the transistor relative to a pixel-side electrode. Thus, the pixel-side electrode can be made very small without reducing the effective width (and therefore on-current) of the transistor.

24 Claims, 3 Drawing Sheets

U.S. PATENT DOCUMENTS

| | | | |
|---|---|---|---|
| 6,104,041 A | 8/2000 | Hseuh et al. | 257/59 |
| 6,147,362 A | 11/2000 | Keyser | 257/59 |
| 6,157,048 A * | 12/2000 | Powell | 257/59 |
| 6,249,326 B1 | 6/2001 | Hebiguchi | 349/42 |
| 6,274,884 B1 * | 8/2001 | Lee et al. | 257/57 |
| 6,284,558 B1 | 9/2001 | Sakamoto | 438/30 |
| 6,307,322 B1 | 10/2001 | Dawson et al. | 315/169.1 |
| 6,307,528 B1 | 10/2001 | Yap | 345/45 |
| 6,307,611 B1 | 10/2001 | Kim et al. | 349/138 |
| 6,344,660 B1 | 2/2002 | Dimitrakopoulos et al. | 257/40 |
| 6,373,453 B1 | 4/2002 | Yudasaka | 345/76 |

* cited by examiner

METHOD AND APPARATUS FOR PROVIDING A HIGH-PERFORMANCE ACTIVE MATRIX PIXEL USING ORGANIC THIN-FILM TRANSISTORS

This application claims the benefit of U.S. Provisional Applications No. 60/269,250 filed on Apr. 10, 2001, which is herein incorporated by reference.

This invention was made with U.S. government support under contract number N61331-98-C-0021 (DARPA OTFT program). The U.S. government has certain rights in this invention.

The present invention relates to a novel pixel structure that employs at least one organic thin-film transistor (OTFT). More specifically, the present invention provides a new transistor structure where an OTFT electrode on the data-line side of the transistor is extended or wrapped around three sides of the transistor relative to a pixel-side electrode.

BACKGROUND OF THE DISCLOSURE

A conventional pixel is shown in FIG. 1. The source and drain contacts for the TFT are made from a metallization layer (such as palladium) that makes an ohmic contact to the organic layer. This metallization layer is also used to form the data lines (column lines) of the display, where it contacts one side of the pixel transistor. The transparent indium-tin oxide (ITO) pixel electrode contacts the metallization on the other side of the transistor. A "pad" of metallization contacts the TFT and lies over the ITO, as shown in FIG. 1. The gate metallization lies under a gate dielectric layer (such as silicon dioxide or silicon nitride) that separates it from the organic layer.

The structure of FIG. 1 has high capacitance between the gate electrode and the source-drain metallization that runs out to the ITO pixel electrode, where the parasitic capacitance is roughly proportional to the area of overlap between the two electrodes. This is a serious issue, since as the transistor makes the transition from an "on" state to an "off" state, this capacitance results in a large capacitive "push-down" (for n-channel TFTs) or "push-up" (for p-channel TFTs) in the pixel voltage when the transistor is turned off. This change in the pixel voltage is about 15 volts for the pixels that are fabricated using the conventional geometry. The capacitance is non-uniform from pixel to pixel, so it leads to non-uniform pixel voltages across the display, i.e., the light intensity across the display will also vary and will be noticeable. It also requires the OTFTs to be able to withstand larger voltages between gate, source, and drain, than they would in the absence of the capacitive effect.

Therefore, a need exists for a novel pixel structure having an OTFT structure that minimizes gate-to-pixel capacitance.

SUMMARY OF THE INVENTION

The present invention is a novel pixel structure having at least one OTFT that minimizes gate-to-pixel capacitance. In one embodiment, the present invention provides a new transistor structure where an OTFT electrode on the data-line side of the transistor is extended or wrapped around three sides of the transistor relative to a pixel-side electrode. Thus, the pixel-side electrode can be made very small without reducing the effective width (and therefore on-current) of the transistor. Using this novel structure, it is possible to reduce the gate-to-pixel capacitance several-fold.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
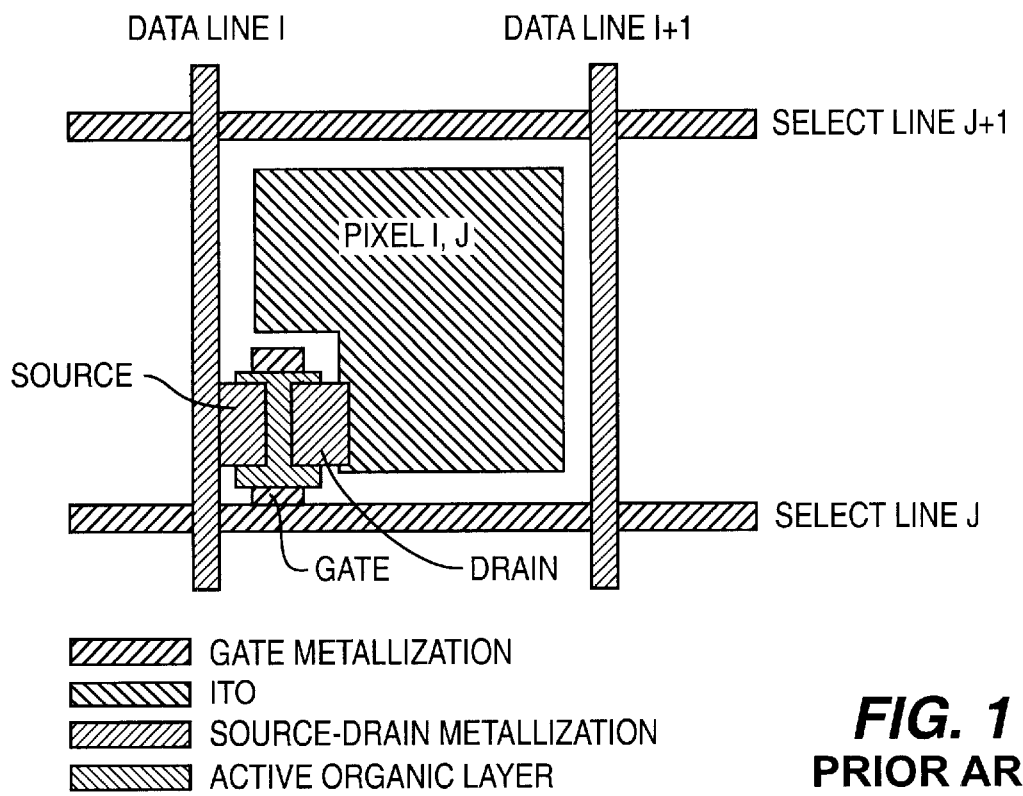
FIG. 1 illustrates a conventional OTFT pixel.
Figure 2:
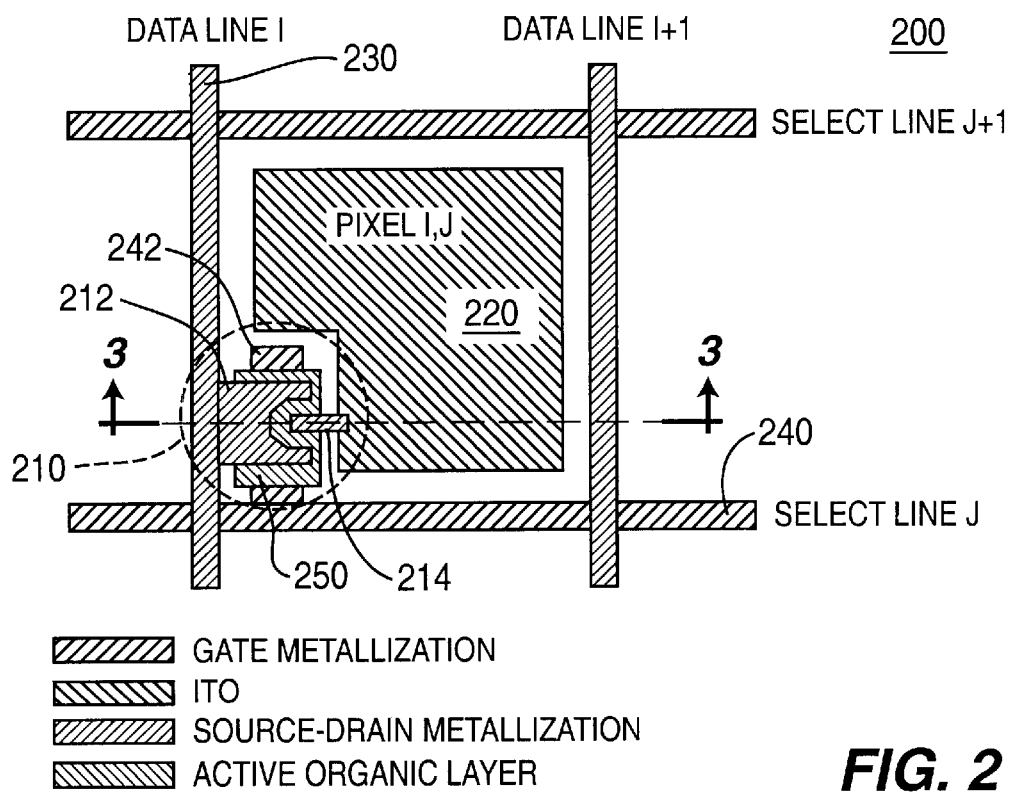
FIG. 2 illustrates a novel OTFT pixel of the present invention.

FIG. 2 illustrates a novel OTFT pixel 200 ("pixel I,J") of the present invention. The designation "pixel I, J" indicates a pixel at a particular grid coordinate in a display having M columns and N rows, with $1 \leq I \leq M$, and $1 \leq J \leq N$.

Specifically, FIG. 2 illustrates an OTFT pixel 200 comprising an organic thin film transistor 210 and a pixel electrode, e.g., a transparent indium-tin oxide (ITO) pixel electrode 220. It should be noted that although an ITO pixel electrode 220 is disclosed in a preferred embodiment of the present invention, the present invention is not so limited. Namely, the present novel OTFT structure can be adapted to operate with other types of pixel electrodes that are coupled to the light-controlling element (not shown) of the pixel.

Each OTFT pixel structure is operated in conjunction with a data line 230 (column line) and a select line 240 (row line). These lines are employed to load data into the pixel and to cause the stored data to be displayed. Thus, each OTFT pixel contains transistor 210 with the source/drain metallization on one side connected to the data line 230. Additionally, the gate electrode 242 is connected to the select line 240.

Figure 3:
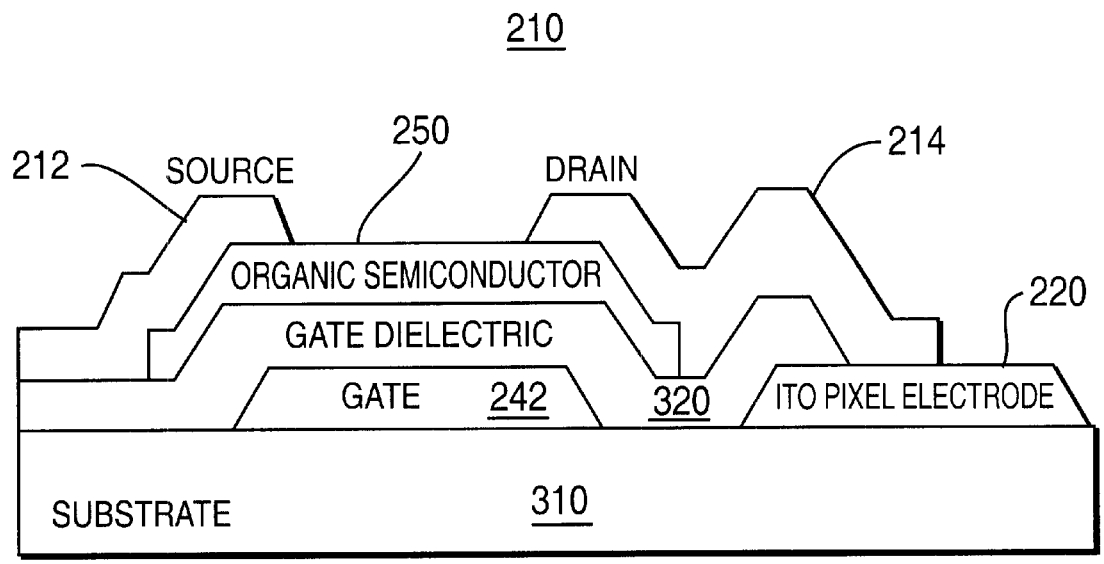
FIG. 3 illustrates a cross section of the OTFT pixel along line 3—3 of FIG. 2.

FIG. 3 illustrates a cross section of the OTFT pixel along line 3—3 of FIG. 2. The reader is encouraged to refer to both FIGS. 2 and 3 to better understand the description of the present invention. Organic thin film transistor 210 comprises a pair of source-drain electrodes 212 and 214, an organic semiconductor layer 250, a gate dielectric layer 320 and a gate electrode 242. These layers and electrodes are deposited onto a substrate 310, e.g., a polyester substrate.

In the present invention, FIG. 2 illustrates a novel transistor structure, where the OTFT electrode (source electrode 212) on the data-line side of the transistor 210 is extended or wrapped around three sides of the transistor relative to the drain electrode 214. Namely, a semi-circular trough is patterned into one end of the source electrode 212 and one end of a smaller drain electrode 214 is laterally positioned within the semi-circular trough. The effect is that one end of the smaller drain electrode 214 is wrapped around on three sides by the larger semi-circular or half-circle like trough end of the source electrode 212.

Thus, the pixel-side electrode (drain electrode 214) can be made very small without reducing the effective width (and therefore on-current) of the transistor. Using the present novel transistor layout, it is possible to reduce the gate-to-pixel parasitic capacitance several-fold. In other words, by using the present novel layout in an OTFT active matrix pixel, the capacitance between the gate and the pixel electrode can be reduced significantly. This reduces the capacitive push-down or push-up (or charge injection) in the pixel voltage when the pixel is deselected, which allows for better display uniformity and reduces the voltage requirements on the transistors.

One important advantage of the present structure is that it still maintains a low resistance for the overall transistor 210. Namely, a low resistance translates into a faster charge time for charging the pixel. It should be noted that the resistance of the transistor is inversely proportional to the width and directly proportional to the length of the source-drain electrodes. In other words, a simple reduction in the width of both source and drain electrodes, while reducing the effect of parasitic capacitance, will actually cause an increase in the resistance of the overall transistor. Thus, the present novel asymmetrical structure strikes a perfect balance that reduces parasitic capacitance while maintaining a desirable low resistance for the overall transistor.

It should be noted that although FIG. 3 illustrates a source electrode 212 being on the left hand side and a drain electrode 214 on the right hand side, those skilled in the art will realize that these electrodes are often referred interchangeably as simply source-drain electrodes. Thus, for the purpose of claim interpretation, the terms "first source-drain electrode" and "second source-drain electrode" should be interpreted broadly as being a source electrode and a drain electrode or vice versa. In other words, depending on a particular implementation or convention, it is possible to have the drain electrode being the larger electrode having the semi-circular end instead of the source electrode.

Additionally, although the present invention refers to a source-drain electrode having a semi-circular trough on one end, the present invention is not so limited. Namely, the inner side of the trough does not have to be a curve surface, but instead can be composed of a plurality of sides (straight and/or curve) as shown in FIG. 2. In fact, the trough can be a semi-oval trough.

Additionally, although the present invention refers to a drain electrode being surrounded by a trough end of the source electrode on "three sides", the present invention is not so limited. Specifically, FIG. 2 shows a drain electrode in a rectangular configuration such that three sides of one end of this rectangular electrode are surrounded on three sides by the trough end of the source electrode. However, those skilled in the art will realize that the end of the drain electrode can be made to be rounded or pointed (like an arrow head) such that it is still disposed within the trough end of the source electrode. These alternate end structures for the drain electrode still fall within the scope of the present invention.

Figure 4:
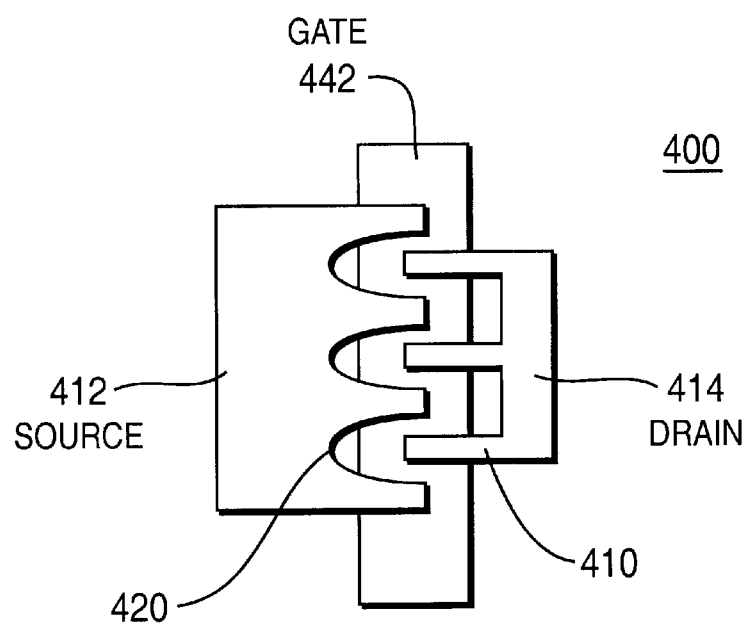
FIG. 4 illustrates an alternate transistor structure of the present invention having a plurality of wrap-around source/finger drain pairs.

FIG. 4 illustrates an alternate transistor structure of the present invention. Specifically, one end of a drain electrode 414 comprises a plurality of "fingers" 410, whereas one end of a source electrode 412 comprises a plurality of semi-circular troughs 420. This novel structure shares the same benefits as noted above for FIG. 2, with the added advantage that the resistance of the overall transistor can now be further adjusted based upon the number of finger/trough pairs that are deployed. Thus, this added benefit is obtained at the expense of a more complex source-drain electrode structure.

Finally, it should be noted the present transistor structure is particularly well suited when used with an organic TFT. Unlike the amorphous silicon used for TFTs, the organic layer can be formed at room temperature, opening up the possibility of making active-matrix liquid-crystal displays (AMLCDs) on inexpensive, lightweight, rugged plastic substrates, as well as other new substrate materials. The organic TFTs have electrical characteristics equivalent to those of amorphous silicon TFTs, so that the performance of plastic AMLCDs is expected to be similar to that of existing glass-based AMLCDs.

In a preferred embodiment of the present invention, the organic layer 250 is pentacene, which is a linear polycyclic aromatic hydrocarbon. However, the organic layer 250 can also be implemented using other organic materials and specifically other linear polycyclic aromatic hydrocarbons such as naphthalene, anthracene, and tetracene with different levels of cost and performance.

Figure 5:
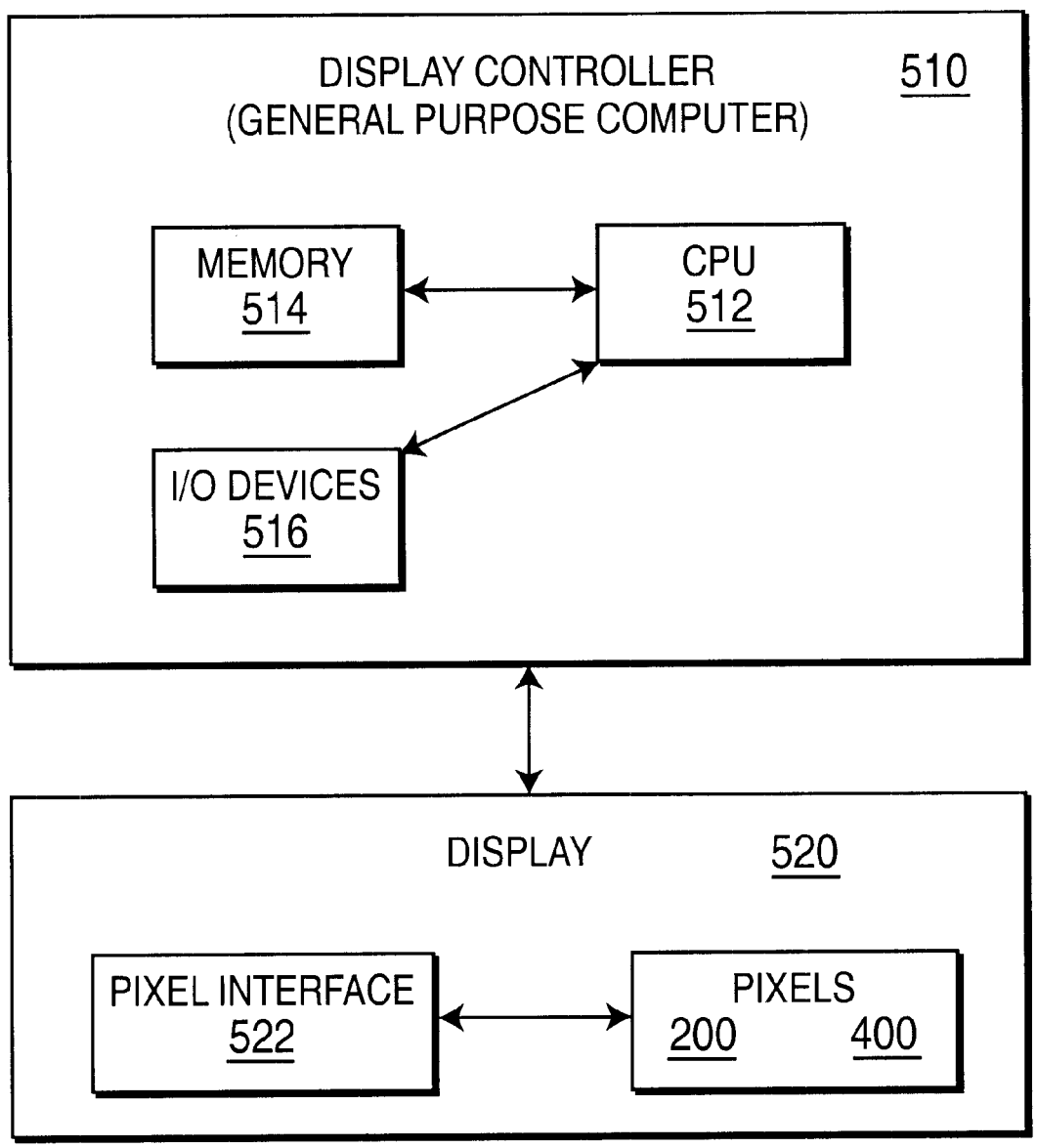
FIG. 5 illustrates a block diagram of a system employing a display having a plurality of OTFT pixel structures of the present invention.

FIG. 5 illustrates a block diagram of a system 500 employing a display 520 having a plurality of active matrix pixel structures 200 and/or 400 of the present invention. The system 500 comprises a display controller 510 and a display 520.

More specifically, the display controller can be implemented as a general purpose computer having a central processing unit CPU 512, a memory 514 and a plurality of I/O devices 516 (e.g., a mouse, a keyboard, storage devices, e.g., magnetic and optical drives, a modem and the like). Software instructions for activating the display 520 can be loaded into the memory 514 and executed by the CPU 512.

The display 520 comprises a pixel interface 522 and a plurality of pixels (e.g., pixel structures 200 and/or 400). The pixel interface 522 contains the necessary circuitry to drive the pixels 200 or 400. For example, the pixel interface 522 can be a matrix addressing interface.

Thus, the system 500 can be implemented as a laptop computer. Alternatively, the display controller 510 can be implemented in other manners such as a microcontroller or application specific integrated circuit (ASIC) or a combination of hardware and software instructions. In sum, the system 500 can be implemented within a larger system that incorporates a display of the present invention.

Additionally, the present pixel structure can be deployed in a flexible and bendable display. This embodiment is disclosed in the paper entitled "AMLCDs Using Organic Thin-Film Transistors On Polyester Substrates", by Kane et al., Society for information Display (SID) International Symposium Digest, Jun. 5, 2001, which is herein incorporated by reference.

Although various embodiments which incorporate the teachings of the present invention have been shown and described in detail herein, those skilled in the art can readily devise many other varied embodiments that still incorporate these teachings.

What is claimed is:

1. A display comprising a plurality of pixels with each pixel having at least one organic thin film transistor (OTFT), said OTFT comprising:

a first source-drain electrode having a first end and a second end, wherein said second end has at least one trough;

a second source-drain electrode having a first end and a second end, wherein said first end of said second source-drain electrode is disposed within said second end of said first source-drain electrode;

an organic layer coupled to said first and second source-drain electrodes;

a gate dielectric layer coupled to said organic layer;

a gate electrode coupled to said gate dielectric layer; and a substrate coupled to said gate electrode.

2. The display of claim 1, wherein said trough of said second end of said first source-drain electrode has a semi-circular configuration.

3. The display of claim 1, wherein said organic layer is a linear polycyclic aromatic hydrocarbon.

4. The display of claim 3, wherein said linear polycyclic aromatic hydrocarbon is pentacene.

5. The display of claim 1, wherein said second source-drain electrode is smaller in size than said first source-drain electrode.

6. The display of claim 1, wherein said second end of said first source-drain electrode has at least two troughs and said first end of said second source-drain electrode has at least two fingers that are disposed within said at least two troughs of said second end of said first source-drain electrode.

7. A display comprising a plurality of pixels, each pixel comprising:
   a pixel electrode; and
   at least one organic thin film transistor (OTFT), said OTFT comprising:
      a first source-drain electrode having a first end and a second end, wherein said second end has at least one trough;
      a second source-drain electrode having a first end and a second end, wherein said first end of said second source-drain electrode is disposed within said second end of said first source-drain electrode and wherein said second end of said second source-drain electrode is coupled to said pixel electrode;
      an organic layer coupled to said first and second source-drain electrodes;
      a gate dielectric layer coupled to said organic layer;
      a gate electrode coupled to said gate dielectric layer; and
      a substrate coupled to said gate electrode.

8. The display of claim 7, wherein said trough of said second end of said first source-drain electrode has a semi-circular configuration.

9. The display of claim 7, wherein said organic layer is a linear polycyclic aromatic hydrocarbon.

10. The display of claim 9, wherein said linear polycyclic aromatic hydrocarbon is pentacene.

11. The display of claim 7, wherein said second source-drain electrode is smaller in size than said first source-drain electrode.

12. The display of claim 7, wherein said second end of said first source-drain electrode has at least two troughs and said first end of said second source-drain electrode has at least two fingers that are disposed within said at least two troughs of said second end of said first source-drain electrode.

13. The display of claim 7, wherein said first end of said first source-drain electrode is for coupling with a data line.

14. The display of claim 7, wherein said pixel electrode is a transparent pixel electrode.

15. The display of claim 14, wherein said transparent pixel electrode is an indium-tin oxide (ITO) pixel electrode.

16. A system comprising:
   a display controller and
   a display, coupled to said display controller, where said display comprises a plurality of pixels, where each pixel comprises:
      a pixel electrode; and
      at least one organic thin film transistor (OTFT), said OTFT comprising:
         a first source-drain electrode having a first end and a second end, wherein said second end has at least one trough;
         a second source-drain electrode having a first end and a second end, wherein said first end of said second source-drain electrode is disposed within said second end of said first source-drain electrode and wherein said second end of said second source-drain electrode is coupled to said pixel electrode;
         an organic layer coupled to said first and second source-drain electrodes;
         a gate dielectric layer coupled to said organic layer;
         a gate electrode coupled to said gate dielectric layer; and
         a substrate coupled to said gate electrode.

17. The display of claim 16, wherein said trough of said second end of said first source-drain electrode has a semi-circular configuration.

18. The display of claim 16, wherein said organic layer is a linear polycyclic aromatic hydrocarbon.

19. The display of claim 18, wherein said linear polycyclic aromatic hydrocarbon is pentacene.

20. The display of claim 16, wherein said second source-drain electrode is smaller in size than said first source-drain electrode.

21. The display of claim 16, wherein said second end of said first source-drain electrode has at least two troughs and said first end of said second source-drain electrode has at least two fingers that are disposed within said at least two troughs of said second end of said first source-drain electrode.

22. The display of claim 16, wherein said first end of said first source-drain electrode is for coupling with a data line.

23. The display of claim 16, wherein said pixel electrode is a transparent pixel electrode.

24. The display of claim 23, wherein said transparent pixel electrode is an indium-tin oxide (ITO) pixel electrode.

* * * * *